(12) United States Patent
Chueh et al.

(10) Patent No.: US 11,768,249 B2
(45) Date of Patent: Sep. 26, 2023

(54) SYSTEMS AND METHODS FOR PREDICTING BATTERY LIFE USING DATA FROM A DIAGNOSTIC CYCLE

(71) Applicants: Toyota Research Institute, Inc., Los Altos, CA (US); The Board of Trustees of the Leland Stanford Junior University, Stanford, CA (US); Massachusetts Institute of Technology, Cambridge, MA (US)

(72) Inventors: William C. Chueh, Stanford, CA (US); Bruis van Vlijmen, San Francisco, CA (US); William E. Gent, Redwood City, CA (US); Vivek Lam, Stanford, CA (US); Patrick K. Herring, Mountain View, CA (US); Chirranjeevi Balaji Gopal, San Jose, CA (US); Patrick A. Asinger, Boston, MA (US); Benben Jiang, Cambridge, MA (US); Richard Dean Braatz, Arlington, MA (US); Xiao Cui, Stanford, CA (US); Gabriel B. Crane, Stanford, CA (US)

(73) Assignees: Toyota Research Institute, Inc., Los Altos, CA (US); Massachusetts Institute of Technology, Cambridge, MA (US); The Board of Trustees of the Leland Stanford Junior University, Stanford, CA (US)

( * ) Notice: Subject to any disclaimer, the term of this patent is extended or adjusted under 35 U.S.C. 154(b) by 91 days.

(21) Appl. No.: 17/218,829

(22) Filed: Mar. 31, 2021

(65) Prior Publication Data
US 2022/0137149 A1 May 5, 2022

Related U.S. Application Data

(60) Provisional application No. 63/107,179, filed on Oct. 29, 2020.

(51) Int. Cl.
*G01R 31/3842* (2019.01)
*G01R 31/392* (2019.01)
(Continued)

(52) U.S. Cl.
CPC ......... *G01R 31/3842* (2019.01); *B60L 58/16* (2019.02); *G01R 31/367* (2019.01);
(Continued)

(58) Field of Classification Search
None
See application file for complete search history.

(56) References Cited

U.S. PATENT DOCUMENTS

2003/0184307 A1 10/2003 Kozlowski et al.
2011/0077880 A1* 3/2011 Gering ................ G01R 31/392
703/13
(Continued)

OTHER PUBLICATIONS

Zhang et al., "Diagnostic Prediction Using Discomfort Drawings," NIPS 2016 Workshop on Machine Learning for Health, pp. 1-5, Dec. 5, 2016.
(Continued)

*Primary Examiner* — Brent A. Fairbanks
(74) *Attorney, Agent, or Firm* — Christopher G. Darrow; Darrow Mustafa PC

(57) ABSTRACT

System, methods, and other embodiments described herein relate to improving the estimation of battery life. In one embodiment, a method includes measuring electrochemical data of a battery cell associated with an electrochemical reaction triggered by a test during a diagnostic cycle. The method also includes determining a feature associated with the degradation of the battery cell from the electrochemical data. The method also includes predicting an end-of-life (EOL) of the battery cell by using the feature in a machine learning (ML) model.

20 Claims, 10 Drawing Sheets

(51) Int. Cl.
*G06N 20/00* (2019.01)
*G01R 31/367* (2019.01)
*B60L 58/16* (2019.01)
*G01R 31/36* (2020.01)

(52) U.S. Cl.
CPC ....... *G01R 31/3648* (2013.01); *G01R 31/392* (2019.01); *G06N 20/00* (2019.01)

(56) References Cited

U.S. PATENT DOCUMENTS

| | | | |
|---|---|---|---|
| 2014/0129163 A1* | 5/2014 | Betzner | H01M 10/486 |
| | | | 702/63 |
| 2018/0143257 A1* | 5/2018 | Garcia | G01R 31/382 |
| 2018/0316204 A1 | 11/2018 | Basu et al. | |
| 2019/0113577 A1* | 4/2019 | Severson | G01R 31/3842 |
| 2020/0014238 A1 | 1/2020 | Daniels | |
| 2020/0164763 A1 | 5/2020 | Holme | |
| 2020/0227791 A1* | 7/2020 | Flueckiger | H01M 10/425 |
| 2020/0284846 A1* | 9/2020 | Pajovic | G01R 31/396 |
| 2021/0293890 A1* | 9/2021 | Gorrachategui | G01R 31/367 |
| 2021/0349157 A1* | 11/2021 | Srinivasan | G01R 31/374 |
| 2022/0140625 A1* | 5/2022 | Nieto | H02J 7/0071 |
| | | | 320/108 |

OTHER PUBLICATIONS

Richardson et al., "Battery health prediction under generalized conditions using a Gaussian process transition model," Journal of Energy Storage, vol. 23, pp. 320-328, Jun. 2019.
Paradis et al., "Pay Attention: Leveraging Sequence Models to Predict the Useful Life of Batteries," arXiv:1910.01347, pp. 1-7, Oct. 5, 2019.
Richardson et al., "Gaussian process regression for forecasting battery state of health," Journal of Power Sources, vol. 357, pp. 209-219, Jul. 2019.
Severson et al., "Data-driven prediction of battery cycle life before capacity degradation," Nature Energy, vol. 4, pp. 383-391, May 2019.
Bill Schweber, "AI Enables Early Predictions of Li-Ion Battery Life," Mechanical & Motion Systems, 5 pages, May 21, 2019, found at https://www.machinedesign.com/mechanical-motion-systems/article/21837811/ai-enables-early-predictions-of-liion-battery-life.

* cited by examiner

FIG. 4A-1
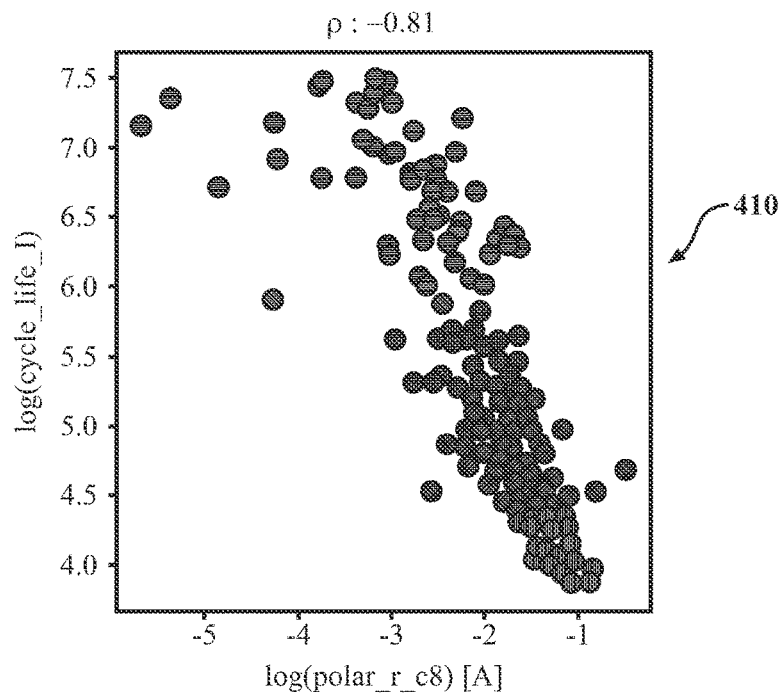
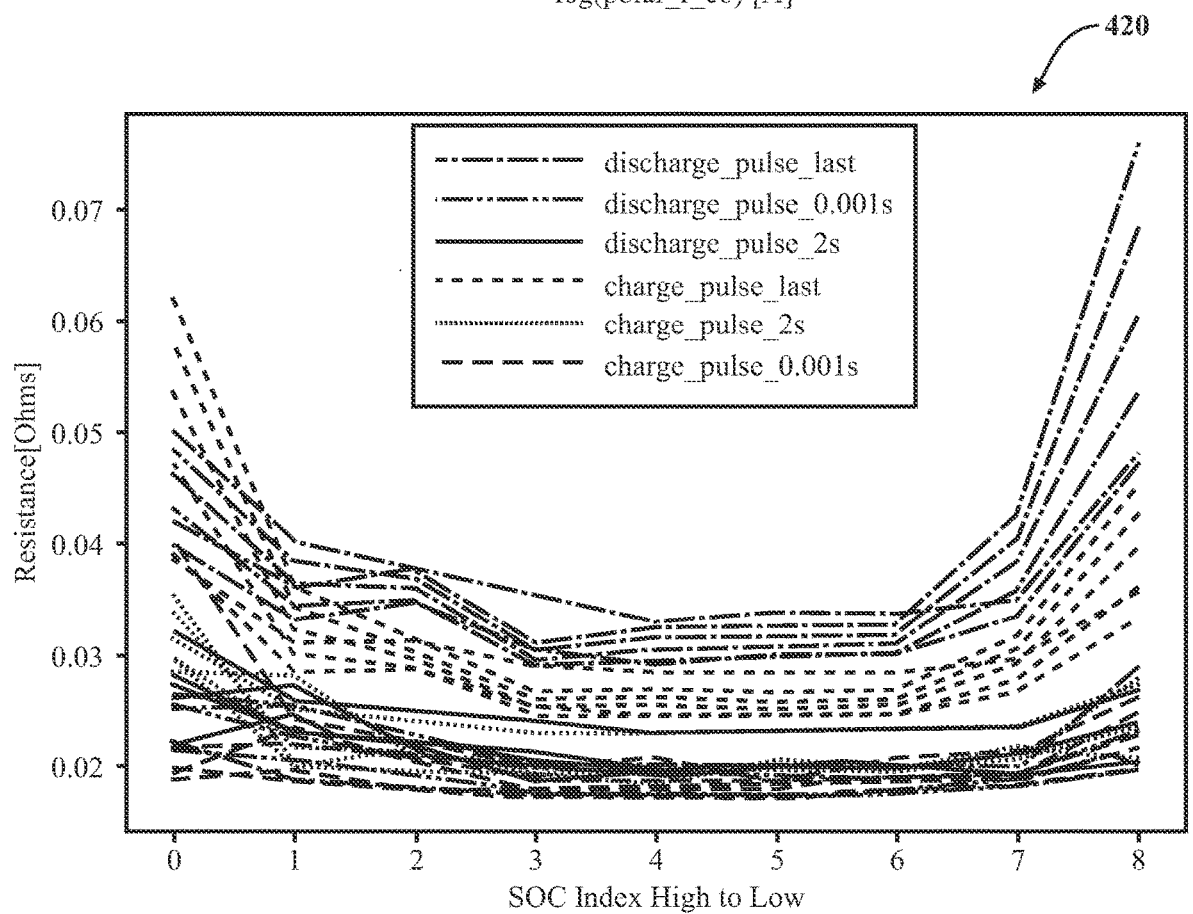
FIG. 4A-2

SYSTEMS AND METHODS FOR PREDICTING BATTERY LIFE USING DATA FROM A DIAGNOSTIC CYCLE

CROSS-REFERENCE TO RELATED APPLICATIONS

This application claims benefit of U.S. Provisional Application No. 63/107,179, filed on Oct. 29, 2020, which is herein incorporated by reference in its entirety.

TECHNICAL FIELD

The subject matter described herein relates, in general, to a prediction system using the data from diagnostic cycles to improve the estimation of battery life.

BACKGROUND

Predicting battery life for electric vehicles (EV) benefits battery recycling and reduces the cost of EVs. A battery may be recycled for second-life applications such as in another EV or even a home. Costs of an EV may also be reduced according to predicted battery life by mitigating degradation to extend the usage of valuable metals in a battery cell.

Battery management systems (BMS) may use numerous charge and discharge cycles until a certain end-of-life (EOL) condition is met. For instance, EOL criteria may be the number of cycles the battery cell(s) completes before the maximum capacity is below an initial capacity. Certain EOL criteria, in various implementations, may require thousands of cycles. A cycle may utilize extended time periods to complete across various or wider margins of operating envelopes. Extended time frames may impede EV maintenance, product design cycles, and research for batteries.

SUMMARY

In one embodiment, example systems and methods relate to a prediction system that improves the estimation of battery life using the data from diagnostic cycles. In various implementations, prediction systems may estimate battery life using data from different types of cycles. In particular, a prediction system using the data from diagnostic cycles may run many cycles to accurately predict an end-of-life (EOL) of a battery. Accordingly, prediction systems using extended time frames can inhibit or slow the EOL estimations used in electric vehicle (EV) applications. Therefore, in one embodiment, a prediction system may accelerate testing of a battery using data-centric operations for battery cycle tests to estimate the EOL. In one approach, the prediction system uses diagnostics to discover certain feature(s) from tests during diagnostic cycles. The tests may trigger electrochemical reactions in a battery cell(s) that reflect a degradation mode or condition occurring internally. The certain feature(s) may be particular for degradation of the battery cell(s) in a vehicle, thereby allowing the system to more accurately predict EOL.

Moreover, the prediction system may use the certain features and information about the degradation mode of the cell to train a machine learning (ML) model. The prediction system may use the ML model to predict the performance of the battery cell in wide or various operating conditions. Furthermore, the system may also predict degradation across operating envelopes of the cell that vary. In this way, the prediction system may accurately estimate the EOL using the data from the diagnostic cycles and the ML model in less cycles or shorter time frames.

In one embodiment, a prediction system for improving the estimation of battery life is disclosed. The prediction system includes a memory communicably coupled to a processor. The memory stores a prediction module including instructions that when executed by the processor cause the processor to measure electrochemical data of a battery cell associated with an electrochemical reaction triggered by a test during a diagnostic cycle. The prediction module also includes instructions to determine a feature associated with the degradation of the battery cell from the electrochemical data and predict an EOL of the battery cell by using the feature in a ML model.

In one embodiment, a non-transitory computer-readable medium for improving the estimation of battery life and including instructions that when executed by a processor cause the processor to perform one or more functions is disclosed. The instructions include instructions to measure electrochemical data of a battery cell associated with an electrochemical reaction triggered by a test during a diagnostic cycle. The instructions also include instructions to determine a feature associated with the degradation of the battery cell from the electrochemical data. The instructions also include instructions to predict an EOL of the battery cell by using the feature in a ML model.

In one embodiment, a method for improving the estimation of battery life is disclosed. In one embodiment, the method includes measuring electrochemical data of a battery cell associated with an electrochemical reaction triggered by a test during a diagnostic cycle. The method also includes determining a feature associated with the degradation of the battery cell from the electrochemical data. The method also includes predicting an EOL of the battery cell by using the feature in a ML model.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be designed as multiple elements or multiple elements may be designed as one element. In some embodiments, an element shown as an internal component of another element may be implemented as an external component and vice versa. Furthermore, elements may not be drawn to scale.

FIGS. 4A-1, 4A-2, 4A-3, 4A-4, 4B-1, and 4B-2 illustrate various features associated with hybrid pulse power characterization (HPPC) resistance, HPPC relaxation, and rate performance test (RPT) dQ/dV for predicting battery life.

DETAILED DESCRIPTION

Systems, methods, and other embodiments associated with improving the estimation of battery life are disclosed herein. A prediction system may predict the degradation of a battery cell(s) by discovering and applying a feature(s) associated with degradation in a machine learning (ML) model. The feature may be related to a rate performance test (RPT), hybrid pulse power characterization (HPPC) resistance, or HPPC relaxation of the battery cell(s) particular to a vehicle. In one approach, the prediction system may measure electrochemical data from a reaction caused by a test. Furthermore, a feature may be related to a physical state of a battery cell(s) that correlates to battery life and/or performs well in the ML model for predicting an end-of-life (EOL). The prediction system may identify a feature for operating conditions that vary and the electrochemical data specific to the vehicle. In this way, the identified features improve the prediction of the EOL in less cycles with increased accuracy for a battery cell(s).

Moreover, the prediction system collects electrochemical data from a battery cell(s) that incorporates information about a degradation mode. The degradation mode may be predictive for complex and non-linear cell degradation. In addition, the prediction system may train the ML model using features produced from data during a diagnostic cycle rather than a regular cycle of a battery cell(s). In this way, the ML model may predict performance in a wide range of operating conditions for a battery cell(s) thereby increasing accuracy.

Furthermore, the prediction system may utilize the ML model for prediction according to training and certain features acquired for a battery cell(s). For example, a cumulative energy output at a diagnostic cycle may use a trained model to predict the energy throughput at subsequent diagnostic cycles for a non-linear degradation of a regular cycle. In one approach, the prediction system may determine the correlation between the feature(s) and energy fade for ML training. Thus, the prediction system may be used by electric vehicle (EV) or consumer electronics (CE) battery designers for improved research and development, predicting life, and servicing by applying features in a ML model.

Figure 1:
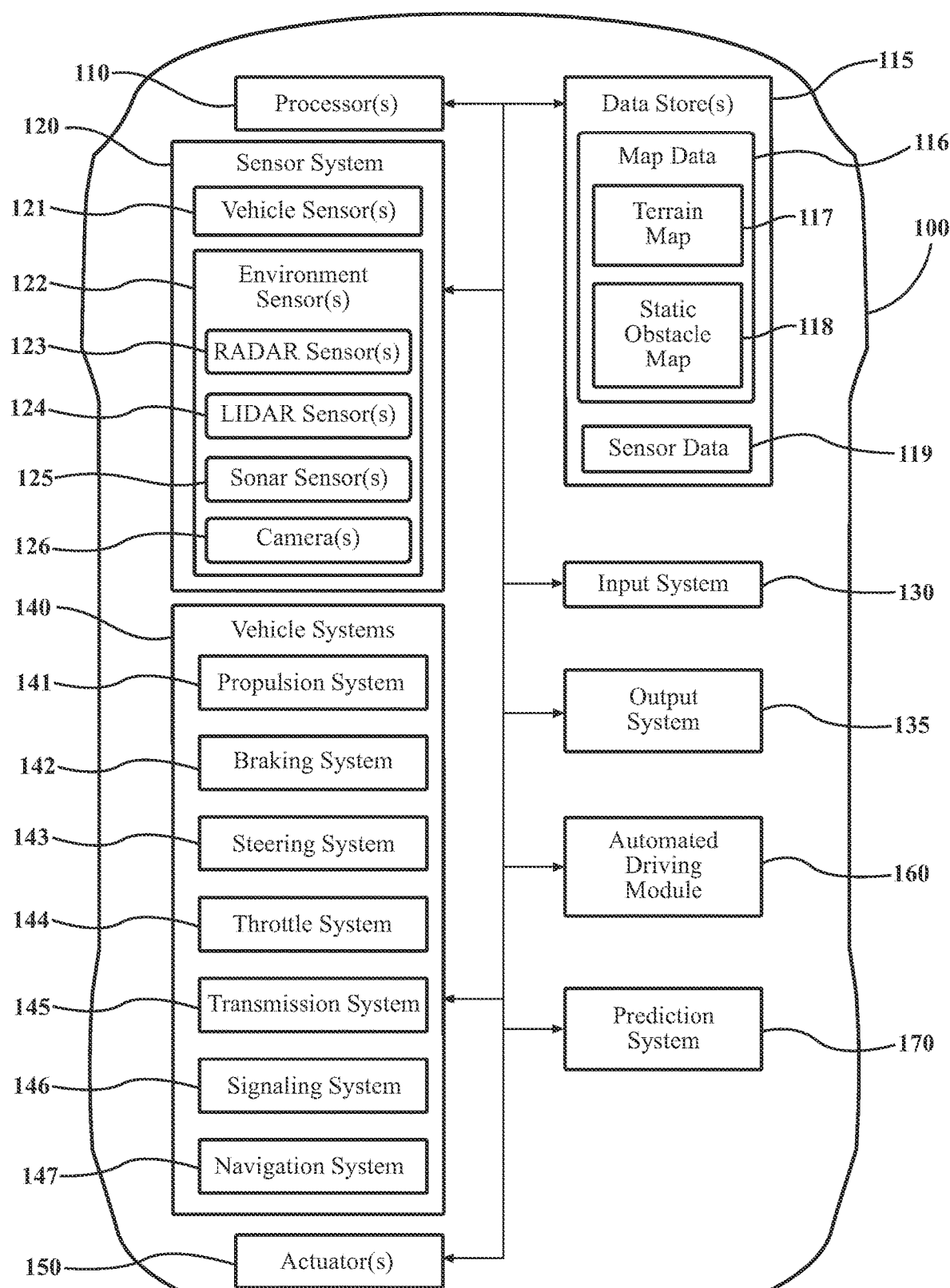
FIG. 1 illustrates one embodiment of a vehicle within which systems and methods disclosed herein may be implemented.

Referring to FIG. 1, an example of a vehicle 100 is illustrated. As used herein, a "vehicle" is any form of motorized transport. In one or more implementations, the vehicle 100 is an automobile. While arrangements will be described herein with respect to automobiles, it will be understood that embodiments are not limited to automobiles. In some implementations, the vehicle 100 may be any robotic device or form of motorized transport that benefits from the functionality discussed herein associated with predicting battery life using data from a diagnostic cycle and features of a battery cell(s).

The vehicle 100 also includes various elements. It will be understood that in various embodiments the vehicle 100 may have less than the elements shown in FIG. 1. The vehicle 100 can have any combination of the various elements shown in FIG. 1. Further, the vehicle 100 can have additional elements to those shown in FIG. 1. In some arrangements, the vehicle 100 may be implemented without one or more of the elements shown in FIG. 1. While the various elements are shown as being located within the vehicle 100 in FIG. 1, it will be understood that one or more of these elements can be located external to the vehicle 100. Further, the elements shown may be physically separated by large distances. For example, as discussed, one or more components of the disclosed system can be implemented within a vehicle while further components of the system are implemented within a cloud-computing environment or other system that is remote from the vehicle 100.

Some of the possible elements of the vehicle 100 are shown in FIG. 1 and will be described along with subsequent figures. However, a description of many of the elements in FIG. 1 will be provided after the discussion of FIGS. 2-7 for purposes of brevity of this description. Additionally, it will be appreciated that for simplicity and clarity of illustration, where appropriate, reference numerals have been repeated among the different figures to indicate corresponding or analogous elements. In addition, the discussion outlines numerous specific details to provide a thorough understanding of the embodiments described herein. Those of skill in the art, however, will understand that the embodiments described herein may be practiced using various combinations of these elements. In either case, the vehicle 100 includes a prediction system 170 that is implemented to perform methods and other functions as disclosed herein relating to improving the prediction of battery life using data from a diagnostic cycle.

Figure 2:
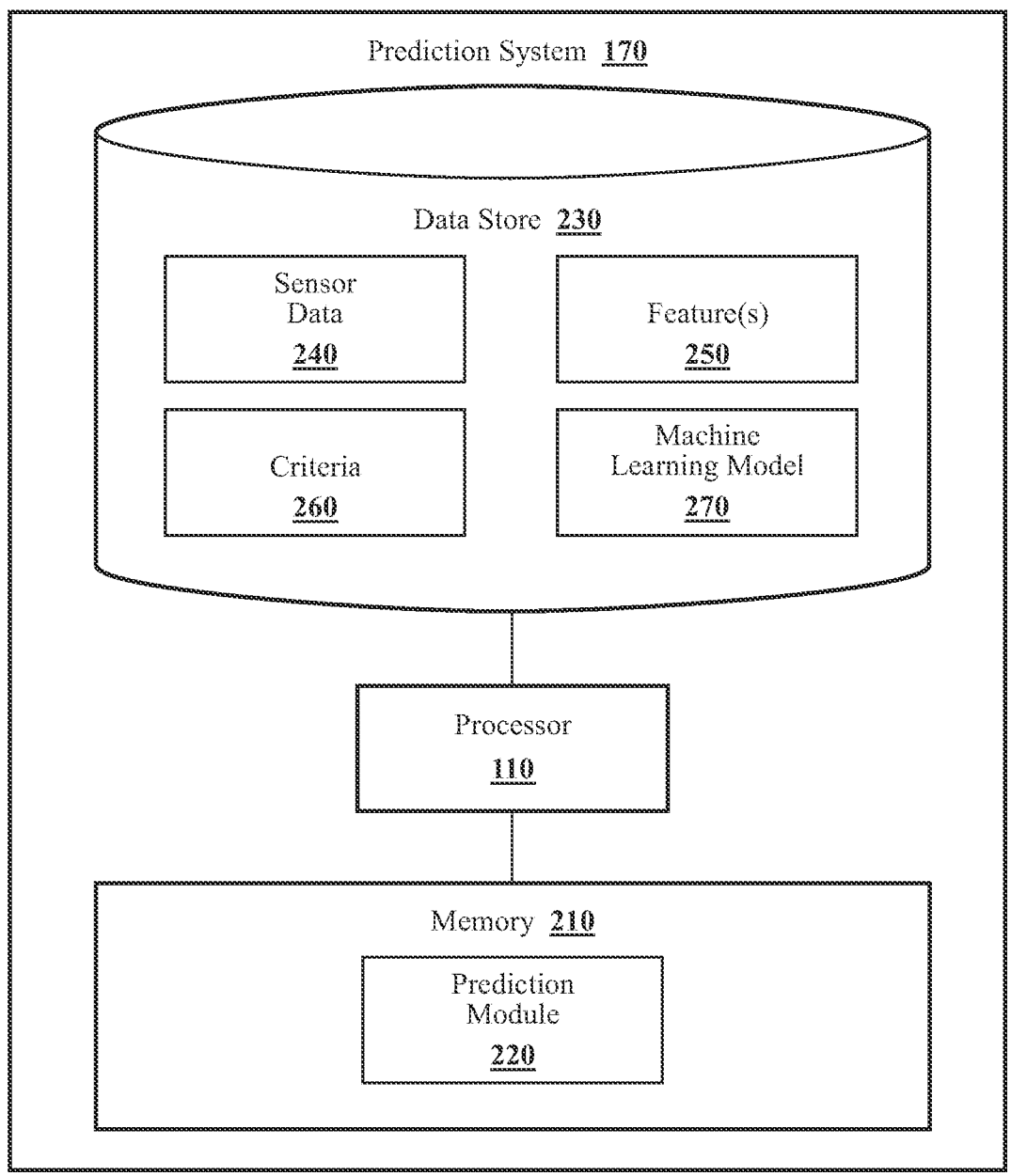
FIG. 2 illustrates one embodiment of a prediction system associated with predicting battery life using the data from a diagnostic cycle.

With reference to FIG. 2, one embodiment of the prediction system 170 of FIG. 1 is further illustrated. The prediction system 170 is shown as including a processor 110 from the vehicle 100 of FIG. 1. Accordingly, the processor 110 may be a part of the prediction system 170, the prediction system 170 may include a separate processor from the processor(s) 110 of the vehicle 100, or the prediction system 170 may access the processor 110 through a data bus or another communication path. In one embodiment, the prediction system 170 includes a memory 210 that stores a prediction module 220. The memory 210 is a random-access memory (RAM), read-only memory (ROM), a hard-disk drive, a flash memory, or other suitable memory for storing the module 220. The module 220 is, for example, computer-readable instructions that when executed by the processor 110 cause the processor 110 to perform the various functions disclosed herein.

The prediction system 170 as illustrated in FIG. 2 is generally an abstracted form of the prediction system 170. With reference to FIG. 2, the prediction module 220 generally includes instructions that function to control the processor 110 to receive data inputs from one or more sensors of the vehicle 100, a battery cell(s), a battery management system(s), and so on. Accordingly, the prediction module 220, in one embodiment, controls the respective sensors to provide the data inputs in the form of the sensor data 240. Additionally, while the prediction module 220 is discussed as controlling the various sensors to provide the sensor data 240, in one or more embodiments, the prediction module 220 can employ other techniques to acquire the sensor data 240 that are either active or passive. For example, the prediction module 220 may passively sniff the sensor data 240 from a stream of electronic information provided by the various sensors to further components within the vehicle 100.

Moreover, in one embodiment, the prediction system 170 includes a data store 230. In one embodiment, the data store 230 is a database. The database is, in one embodiment, an electronic data structure stored in the memory 210 or another data store and that is configured with routines that can be executed by the processor 110 for analyzing stored data, providing stored data, organizing stored data, and so on. Thus, in one embodiment, the data store 230 stores data used by the module 220 in executing various functions. In one embodiment, the data store 230 includes the sensor data 240 along with, for example, metadata that characterize various aspects of the sensor data 240. In one embodiment, the data store 230 further includes the feature(s) 250, the criteria 260, and the ML model 270 associated with predicting battery life using diagnostic data. In one approach, the feature(s) 250 may be related to any one of an RPT, HPPC resistance, and HPPC relaxation of a battery cell(s). As explained below, the prediction system 170 may use characteristics of the RPT, the HPPC resistance, and the HPPC relation of a battery cell(s) for determining features to use in the ML model 270 for predicting battery life.

Furthermore, the criteria 260 may be associated with confidence intervals or non-linear models (e.g., logarithmic, exponential, etc.) to determine that the feature satisfies the criteria for predicting an EOL. For example, a criterion may provide that a feature(s) accurately forecasts degradation above 95% for the ML model 270. The ML model 270 may be a convolutional neural network (CNN) for predicting battery life. Of course, in further aspects, the ML model 270 may be deep convolutional encoder-decoder models, a neural network model, and so on.

The prediction module 220, in one embodiment, is further configured to perform additional tasks beyond controlling the respective sensors to acquire and provide the sensor data 240. For example, the prediction module 220 includes instructions that cause the processor 110 to perform a more efficient series of tests during a diagnostic cycle that indicate the state-of-health (SOH) of a battery cell(s). During a regular cycle, battery cells may be charged and discharged between any one of a voltage V1 and V2, a continuous battery cell(s) voltage, a battery cell(s) current, a battery cell(s) temperature, the battery cell(s) internal resistance of a battery cell(s) during cycling, and so on. However, the prediction system 170 may use data streams from other types of measurements or events during a diagnostic cycle to hasten and improve the estimation of battery life.

Moreover, after a predetermined number of regular cycles, the prediction system 170 may apply a diagnostic cycle on the battery cell(s) for testing. A test during a diagnostic cycle may include a reset cycle, a feature test(s) for an HPPC resistance, a feature test(s) for an HPPC relaxation, various RPT tests, a potentio-static intermittent titration technique (PITT) procedure, a galvano-static intermittent titration technique (GITT) procedure, an electrochemical impedance spectroscopy (EIS) procedure, and so. In one approach, the prediction system 170 may select a test according to the chemistry or physical properties of a battery cell(s). In order to trigger certain electrochemical reactions for measuring a feature, the prediction system 170 may also select a test according to a structure, package, materials, or the like of a battery cell(s). In addition, multiple cells may be cycled with a wide range of different regular cycles for training the ML model 270. In this way, the training data encompasses the operating envelope for a particular battery by accounting for various types, sizes, shapes, or chemistries of a battery cell. In one or more embodiments, the prediction system 170 uses an ML model such as a CNN for predicting battery life. Of course, in further aspects, the prediction system 170 may employ different ML models or implements different approaches for performing the associated functions, which may include any one of deep convolutional encoder-decoder models, a neural network model, an encoder-decoder network model, a deep learning network model, a linear regression model, an elastic net model, a random forest (RF) model, and so on.

Figure 3A:
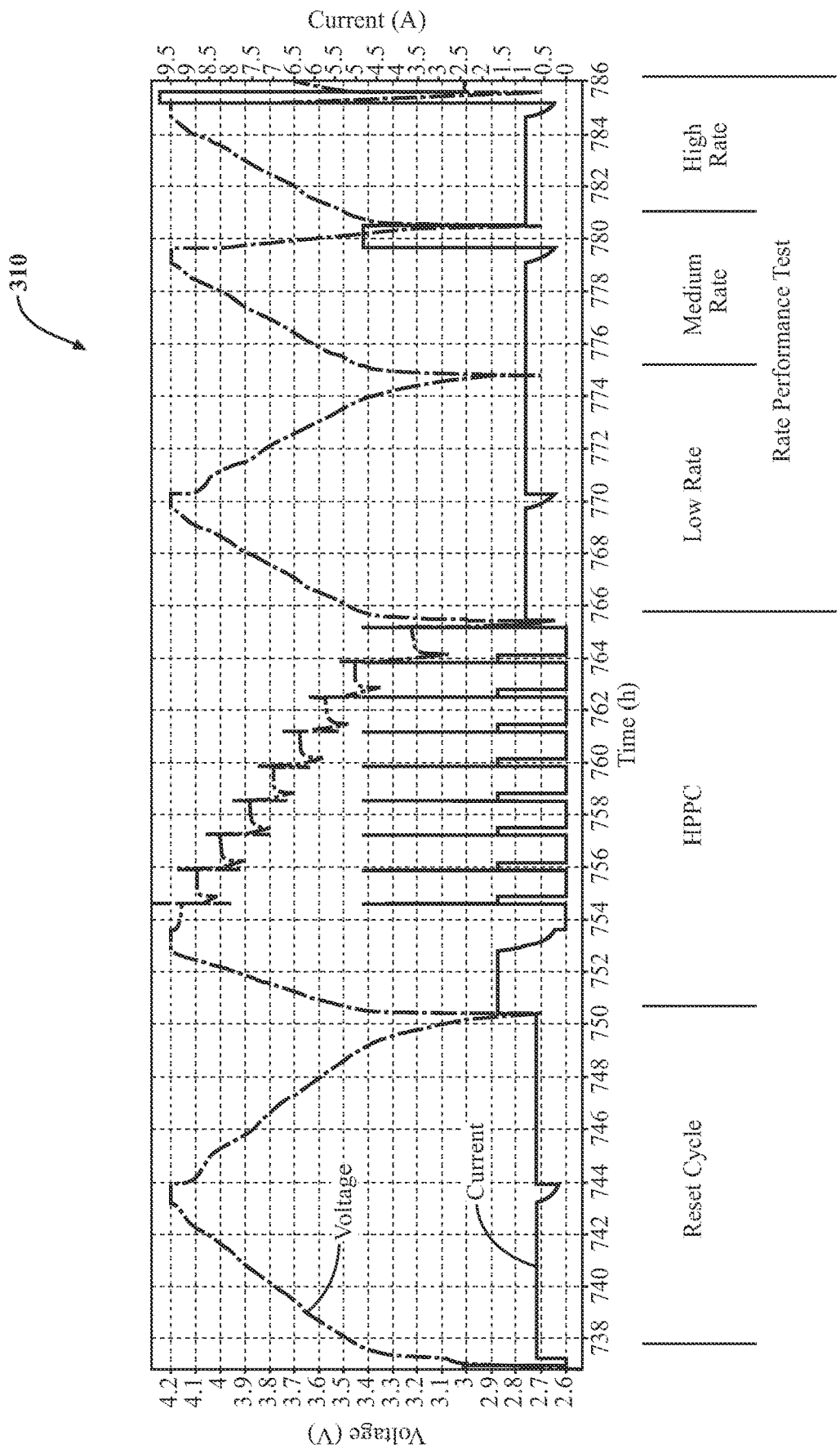
FIGS. 3A, 3B, and 3C illustrate various examples of information related to predicting battery life using the data from a diagnostic cycle.
Figure 3B:
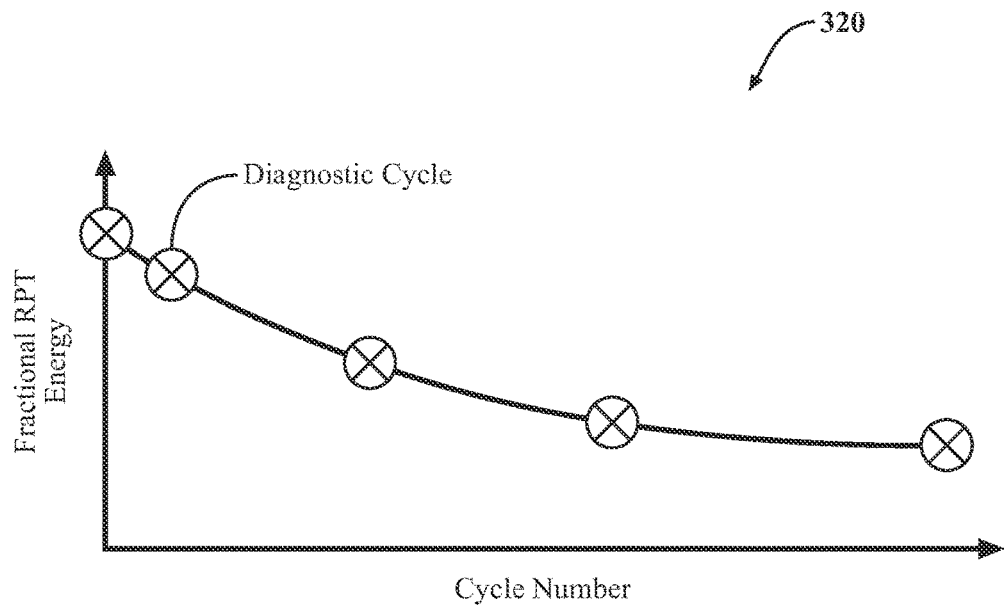
Figure 3C:
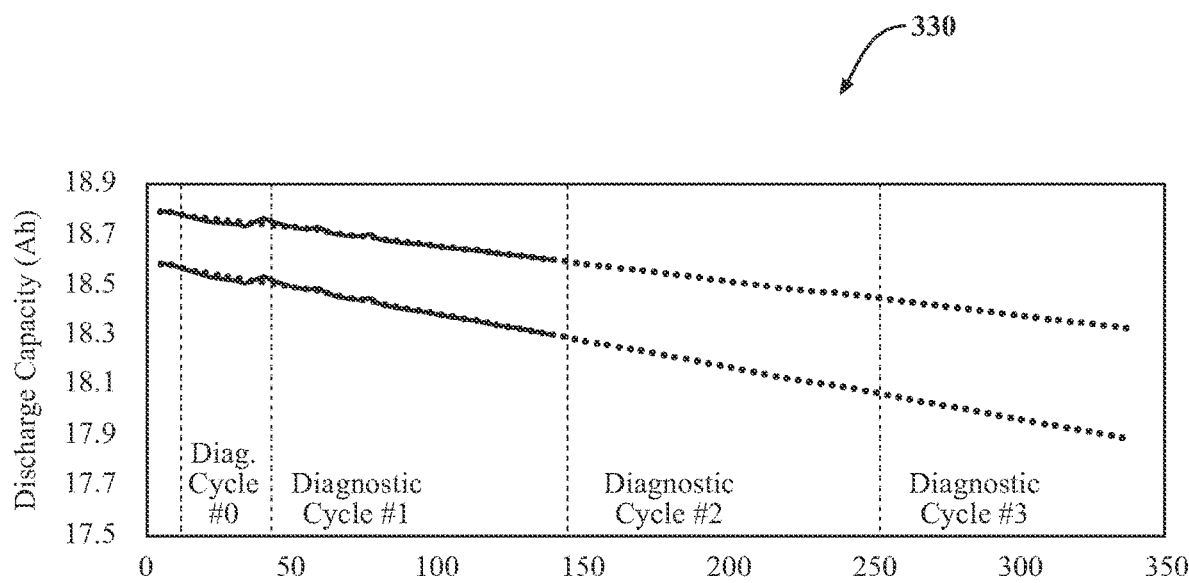
Figures 3, 4A:
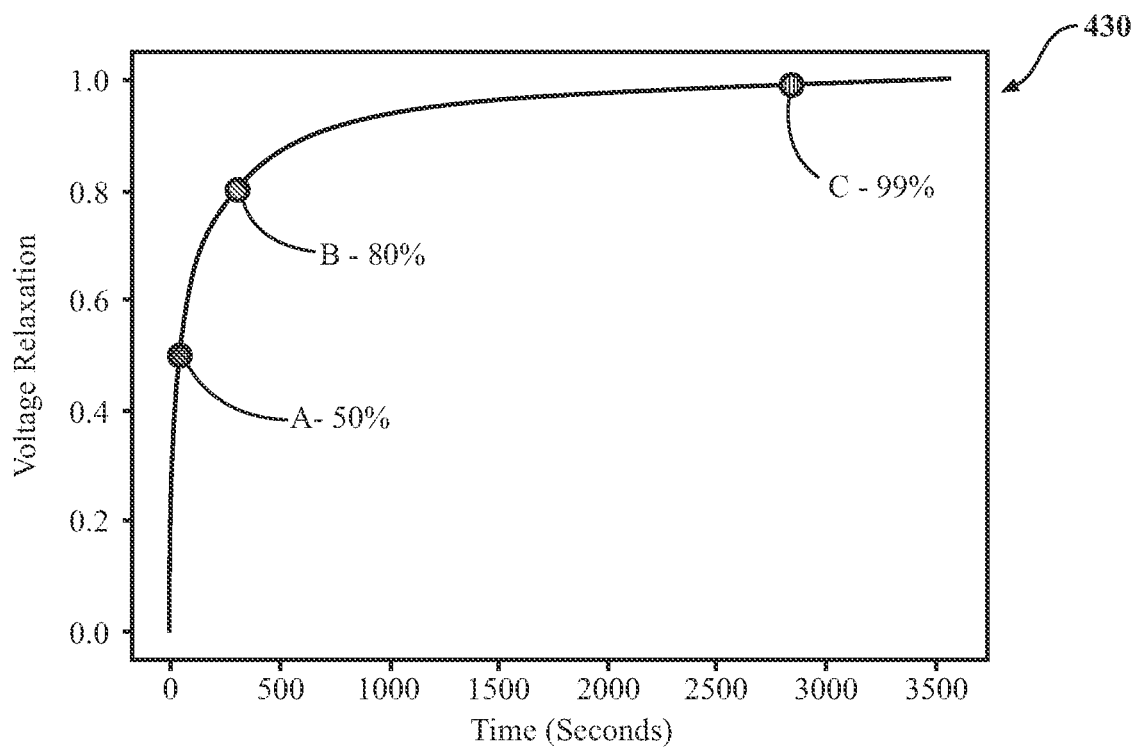
Figures 4, 4A:
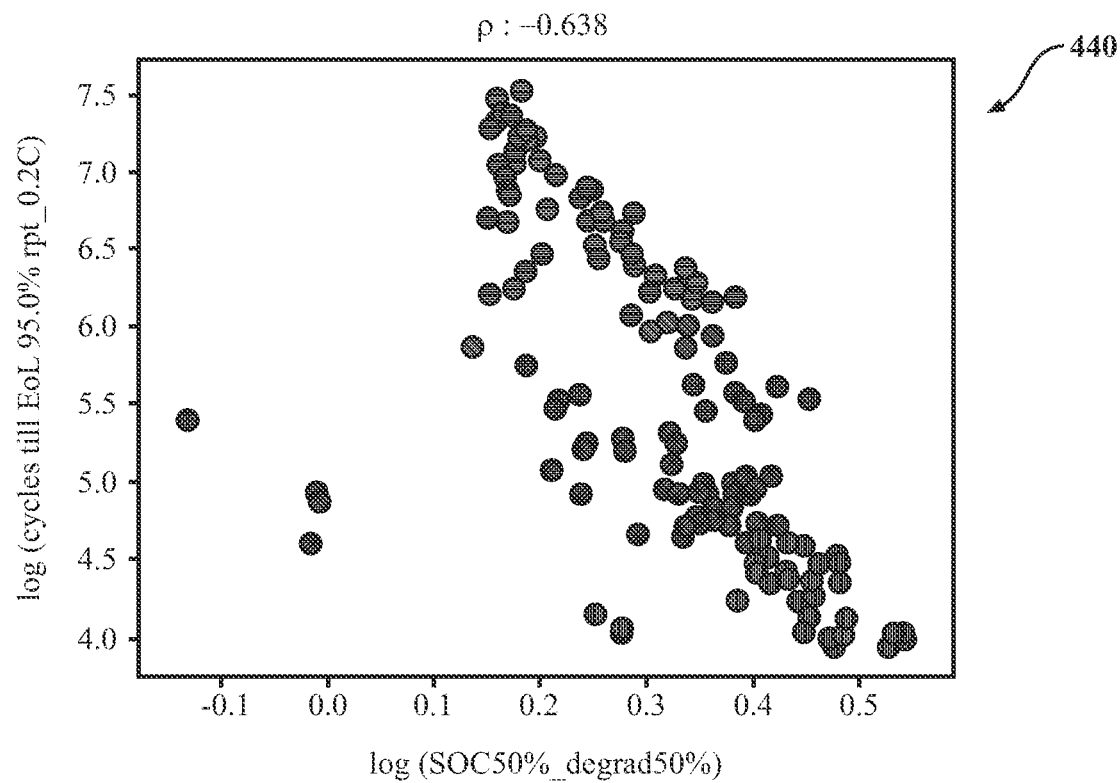
Figures 1, 4B:
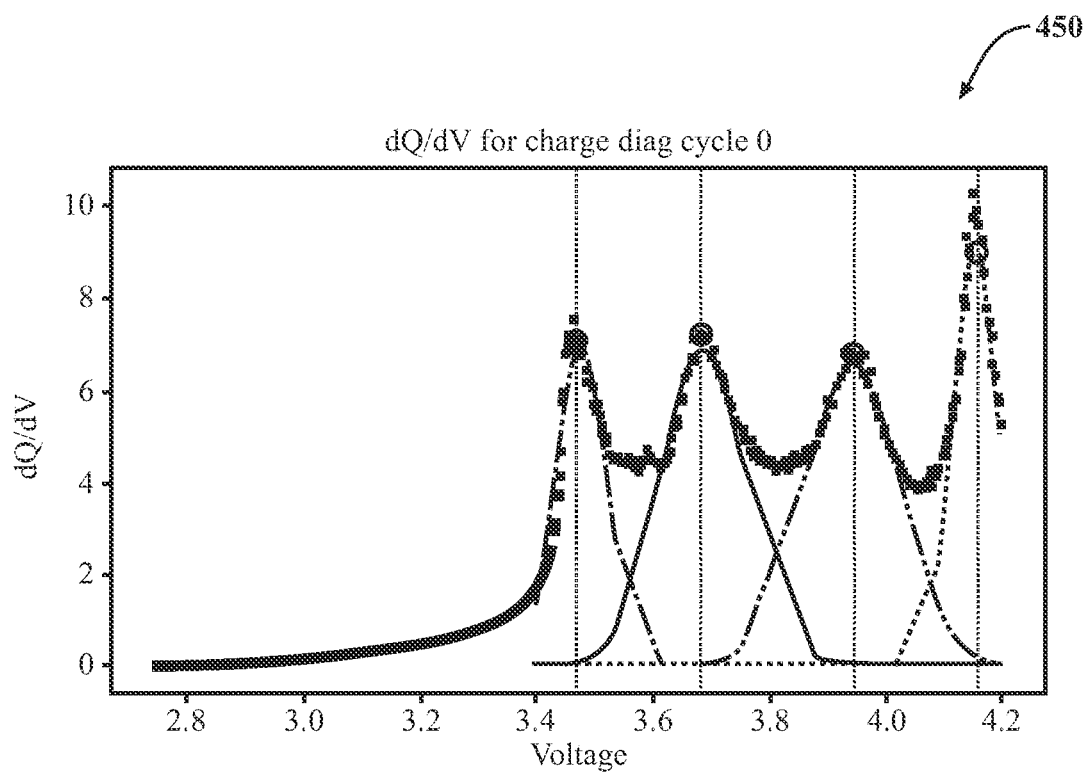
Figures 2, 4B:
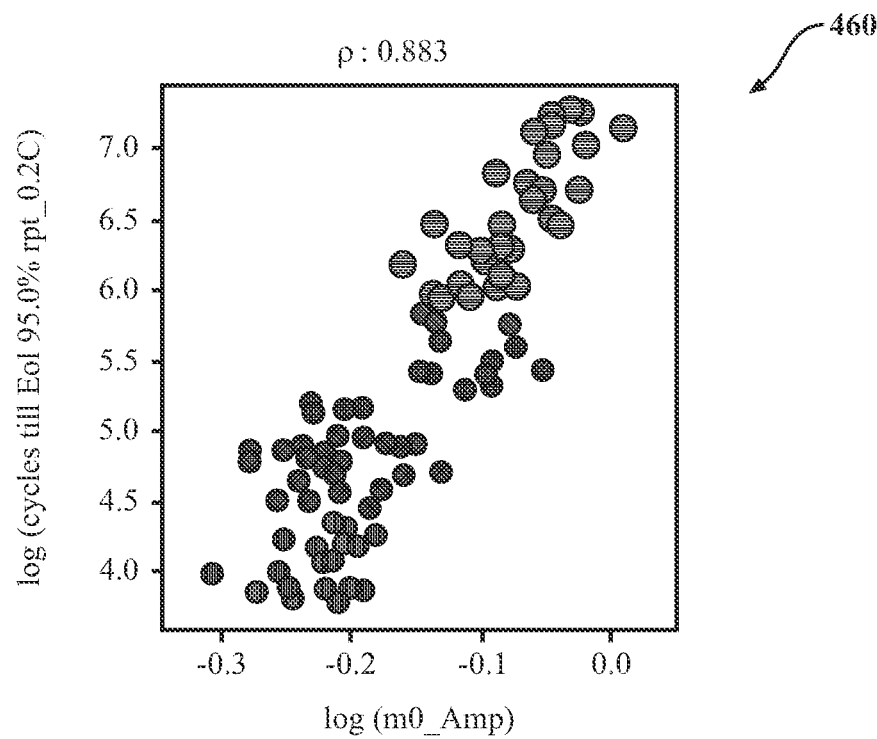

Turning to FIGS. 3A, 3B, and 3C, various examples are illustrated of information related to predicting battery life using data from a diagnostic cycle. In FIG. 3A, chart 310 shows potential and unknown features discovered from a diagnostic cycle associated with a battery cell(s) with voltage and current changing over a certain number of hours. Features associated with a diagnostic cycle may include a feature related to any one of an RPT dQ/dV, an HPPC resistance, an HPPC relaxation, and so on. Features related to an RPT test may be any one of low rate, medium rate, and high rate. Concerning RPT, in FIG. 3B chart 320 shows a trajectory or projection of degradation with a successive or subsequent diagnostic cycle. In particular, the prediction system 170 may measure degradation as fractional RPT energy. Over a longer span of cycles, the drop of fractional RPT energy may hasten. Thus, the prediction system 170 may account for this effect when triggering electrochemical reactions. The prediction system 170 may also apply discovered feature(s) of a battery cell(s) for improving the prediction of an EOL or life span according to the drop of fractional RPT energy.

Furthermore, a prediction system 170 may measure multiple data points for a diagnostic cycle associated with a battery cell(s). In FIG. 3C, chart 330 shows discharge capacity for a battery cell(s) from diagnostic cycle 0 to 3 for similar battery cells in the vehicle 100. Within a test during a diagnostic cycle may be an index for a diagnostic capacity that the prediction system 170 may measure. In chart 330, similar battery cells from the vehicle 100 may show different rates of degradation indicating the need for a certain feature(s) acquisition or engineering to predict the EOL. Thus, the chart 330 illustrates that cells from the same vehicle, cycled under the same conditions, can exhibit different rates of degradation or decay.

FIGS. 4A-1, 4A-2, 4A-3, 4A-4, 4B-1, and 4B-2 illustrate various features associated with HPPC resistance, HPPC relaxation, and RPT dQ/dV for predicting battery life. Charts 410 and 420 illustrate a feature(s) for an HPPC resistance derived from calculating resistance at different states-of-charge (SOC) associated with an HPPC. Chart 410 shows battery cells have different long and short life cycles according to use. In one approach, a feature(s) for an HPPC resistance may capture lithium plating, pulse power, and so on related to a battery cell(s). As explained below, the prediction system 170 may use potential or discovered features such as HPPC resistance for a battery cell(s) to improve the prediction of an EOL using the ML model 270.

Charts 430 and 440 illustrate that the prediction system 170 may calculate multiple features for HPPC relaxation for time constants at a stage of an HPPC test(s). In 430, the y-axis represents the relative voltage relaxation after discharge of the HPPC test(s), with values on that y-axis ranging from 0 to 1, and the x-axis represents time in seconds. A value of 1 may represent 100% voltage relaxation. Points A, B, and C refer to the level of voltage relaxation. The time taken for the battery cell(s) to reach levels of relaxation can reveal characteristics of the kinetics in the cell(s), sometimes referred to as relaxation time constants.

Moreover, chart 440 shows battery cells having different long and short life cycles according to use. In comparison, charts 450 and 460 illustrate that the prediction system 170 may derive a feature for RPT dQ/dV of a battery cell(s) from fitting peaks of measured data to a Gaussian model. The peaks may be fitted for various voltage levels by the prediction system 170 depending on the battery cell(s). Related to the test(s) in FIG. 4, the prediction system may use current, μ, or σ associated with features to predict degradation. The variable μ may be the mean of the fitted Gaussian model and the variable a may be the standard deviation of the fitted Gaussian model. In one approach, the prediction system 170 may utilize μ or σ to fit an RPT capacity, such as dQ/dV, incrementally using a Gaussian model. Moreover, a feature(s) for RPT dQ/dV may capture degradation mechanisms in a battery cell(s) such as resistance rise, loss of active material (LAM), loss of lithium inventory (LLI), retardation of internal kinetics, and so on of a battery cell(s) for the prediction system 170 to predict the EOL.

Figure 5:
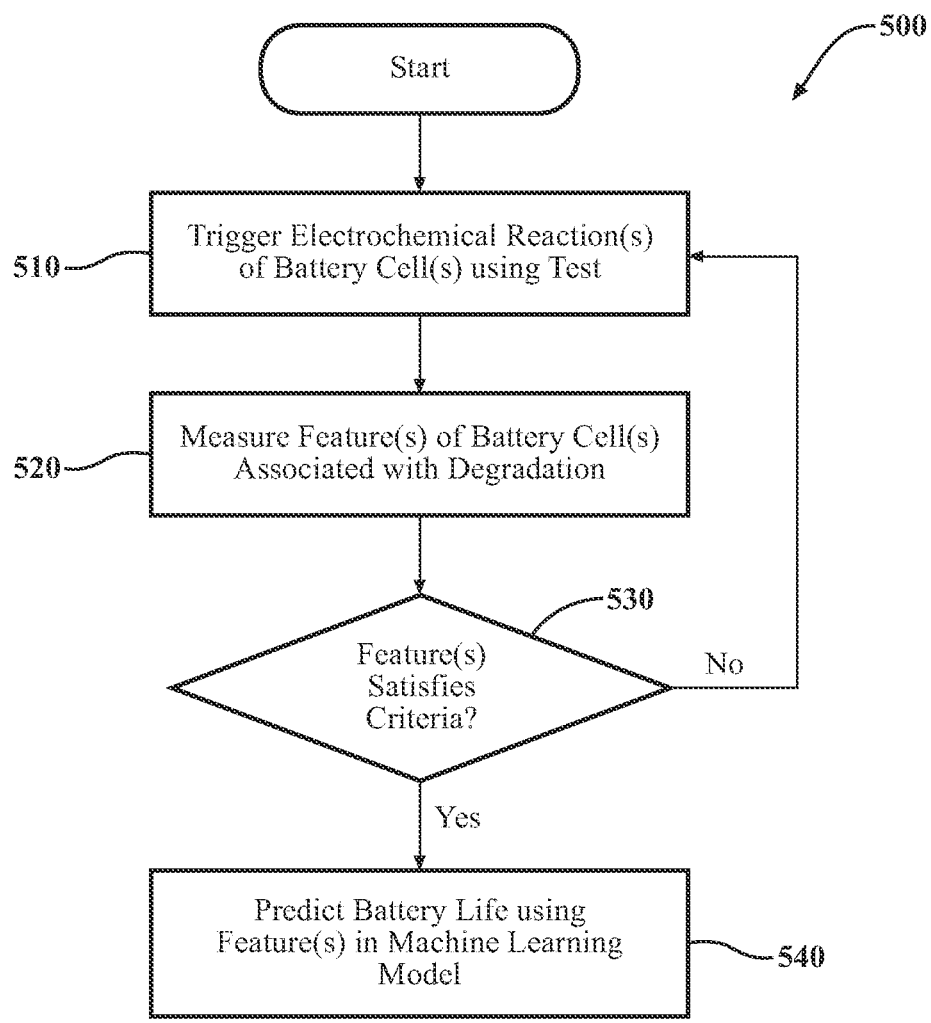
FIG. 5 illustrates one embodiment of a method associated with predicting battery life using a machine learning (ML) model.

FIG. 5 illustrates a flowchart of a method 500 associated with predicting battery life using an ML model. Method 500 will be discussed from the perspective of the prediction system 170 of FIGS. 1 and 2. While method 500 is discussed in combination with the prediction system 170, it should be appreciated that the method 500 is not limited to being implemented within the prediction system 170 but is instead one example of a system that may implement the method 500.

In the method 500, the prediction system 170 may use a particular test(s), such as HPPC or RPT, over various diagnostic cycles for a battery cell(s) to discover unknown features. In one approach, the test may forecast cell degradation by grouping tests for different parameters. The prediction system 170 may also use a series of steps or parameters to measure a feature(s). For example, a parameter may relate to changing voltage levels at a certain rate to trigger electrochemical reactions for a battery cell(s).

As explained herein, a feature may be related to any one of an RPT, HPPC resistance, and HPPC relaxation of a battery cell(s). A feature may also be related to a physical state of a battery cell(s) that correlates to battery life and/or performs well in the ML model 270 for predicting an EOL. The prediction system 170 may transform raw data into specific points or spectrums to identify properties or characteristics of the degradation that particularly correlate to the vehicle 100.

At 510, the prediction system 170 triggers an electrochemical reaction(s) of a battery cell(s) using a test, such as during a diagnostic cycle. For example, an electrochemical reaction(s) may be selected by the prediction system 170 in order to discover or identify a feature(s) that correlates to battery life for a particular vehicle 100 or battery pack. The prediction system 170 may also identify a feature(s) that performs well in the ML model 270 for predicting the EOL. The electrochemical reaction may reflect a degradation mode or condition occurring internally in the cell. The feature may be related to a physical state of a battery cell(s). In one approach, the feature(s) may be related to an RPT, HPPC resistance, or HPPC relaxation of the battery cell(s). Furthermore, the prediction system 170 may test the battery cell(s) at operating conditions that vary to improve forecasting of degradation.

At 520, the prediction system 170 measures a feature(s) for a battery cell(s) associated with degradation during the diagnostic cycle. The measurements may include collecting electrochemical data of a battery cell(s) according to the electrochemical reaction triggered by the prediction system 170. The collected electrochemical data may incorporate information about the degradation mode of a battery cell(s). The degradation mode may be predictive for complex and non-linear cell degradation used by the prediction system 170 to determine the feature. In one approach, a feature(s) may rely on electrochemical measurements from the diagnostic cycles so that the prediction system 170 determines spot-diagnostic or prognostics for a battery pack SOH agnostic to a load history of a battery cell(s).

At 530, the prediction system 170 determines if the feature(s) satisfies the criteria 260. For example, the prediction system 170 may use confidence intervals or non-linear models (e.g., logarithmic, exponential, etc.) to determine that the feature satisfies the criteria for predicting the EOL. For example, a criterion may provide that a feature(s) accurately forecasts degradation above 95% for the ML model 270. In one approach, the prediction system 170 may use 510, 520, or 530 as preprocessing or engineering features prior to application in the ML model 270. In this way, the prediction system 170 may use a discovered or unknown feature of a battery cell(s) to more reliably forecast degradation under live operation.

At 540, if criteria are satisfied, the prediction system 170 forecasts degradation of a battery cell(s) using the feature(s) in the ML model 270. Due to the preprocessing or engineering of features, use of the ML model 270 may reflect degradation from various operating conditions. The ML model 270 may be any one of a CNN model, deep convolutional encoder-decoder models, a neural network model, an encoder-decoder network model, a deep learning network model, a linear regression model, an elastic net model, a RF model, and so on. As described below, the prediction system 170 may predict degradation according to training models associated with a cumulative energy output until the EOL for different discharge C-rates. In this way, the prediction system 170 may reflect energy retention ability to deliver power at various levels of demand or load. In particular, retention ability may be relevant in mapping the cycling degradation of a battery cell(s) with varying levels of power demand or load.

Furthermore, the cumulative energy output at a diagnostic cycle may use a trained model to predict the energy throughput at future diagnostic cycles for non-linear trajectories of regular cycle degradation. In one approach, a fraction of discharge energy at a diagnostic cycle may be utilized as a combination of the cumulative energy output at a diagnostic cycle to predict the non-linear trajectory of discharge energy degradation for different levels of power demand. Accordingly, the prediction system 170 uses the ML model 270 to output an EOL value with increased reliability by leveraging various effects associated with degradation of a battery cell(s).

Figure 6:
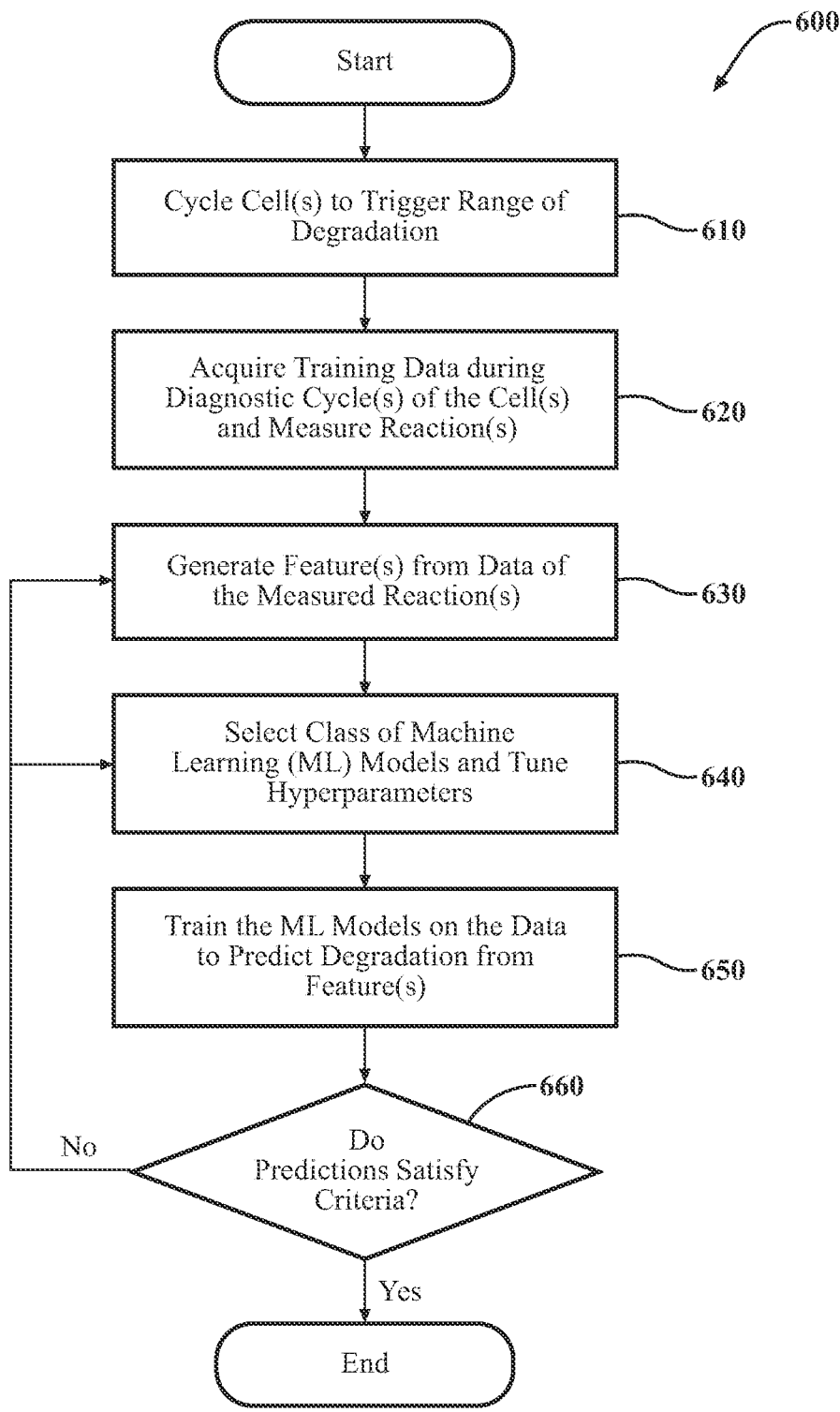
FIG. 6 illustrates one embodiment of a method associated with training an ML model for predicting battery life.

FIG. 6 illustrates one embodiment of a method 600 associated with training an ML model for predicting battery life. At 610, the prediction system 170 cycles a battery cell(s) to trigger a range of degradation. The prediction system 170 may cycle the battery cell(s) under various conditions to initiate a range of degradations. In this way, the prediction system 170 incorporates information about the degradation of a battery cell(s) for a particular vehicle 100 or battery pack under live operation.

At 620, the prediction system 170 acquires training data during a diagnostic cycle of the battery cell(s) and measures an electrochemical reaction(s). The prediction system 170 may acquire the training data through cycling, a battery cycling instrument, a plurality of battery cells between a voltage V1 and voltage V2, for which the values of V1 and V2 might vary from cycle to cycle, and so on. In one approach, the prediction system 170 may also acquire the training data at specified points in a lifetime of a battery cell(s) and measure corresponding electrochemical reactions during a diagnostic cycle. Furthermore, a component may vary discharge profiles to subject the cells to a multitude of loading scenarios such as constant current-voltage, environment protection agency (EPA) recommended driving profiles, and so on. Discharge profiles may also be varied according to cell chemistries. The prediction system 170 may perform tests during a diagnostic cycle for a predefined number of cycles and/or degree of degradation to trigger and measure electrochemical reactions in the battery cell(s) and generate data for training.

Moreover, the test(s) may apply any one of current pulses, current interrupts, current charges constantly at a specific rate, current discharges constantly, and so on. In one approach, a test(s) may apply any one of specific rate current discharges varying at a rate defined by a functional form for a SOC or current charges varying at a rate defined by a functional form for the SOC of a battery cell(s). Concerning voltage holds, the test(s) during a diagnostic cycle may measure data related to holds for constant voltage with non-zero current, holds for constant voltage with non-zero current, and so on. In addition, a test(s) may measure physical properties for a battery cell(s) such as current, voltage, temperature, internal resistance, swelling, changes in cell thickness, changes in cell diameter, and so on.

At 630, the prediction system 170 generates a feature(s) from the data of the measured electrochemical reactions. For example, the prediction system 170 may generate a feature(s) by extracting and defining any one of a magnitude change, an absolute magnitude, physical transformations, convolutional featurization, and so on. The prediction system 170 may calculate selected features from measured data of electrochemical reactions of physical properties collected during a plurality of tests in a diagnostic cycle. The features may be a physical characteristic of the battery cell(s) such as any one of an ohmic resistance, a polarization resistance, time constants associated with transfer kinetics, a lithium plating metric, a plated lithium stripping metric, a lithium inventory metric, and so on. In one approach, a feature(s) may be the relative change of a physical characteristic of the battery cell(s) between two or more cycles, an empirical measure, the relative change of an empirical measure between two or more cycles, a temporal convolution using a one-dimensional kernel of any measured physical property, and so on.

At 640, the prediction system 170 selects a class of ML models, such as the ML model 270, and tunes hyperparameters. A class of an ML model may be selected according to battery chemistry, structure, physics, and so on that correlates to an EOL degradation. As an example, a class of the ML model may be linear regression, a neural network, and so on. The characteristics or architecture of the ML model may be associated with non-linearities in the neural network, a technique for loss minimization of the neural network, and so on. The characteristics or architecture may be expressed or quantified as hyperparameters of the ML model. Selection of the hyperparameters may determine the performance from the ML model and be made according to different data types. Accordingly, hyperparameters may be tuned to automatically select an ML model or a related class according to the needs of the system.

At 650, the prediction system 170 trains the ML models on data to predict degradation from a feature(s). In one approach, the prediction system 170 may train the ML model 270 using a correlation between a feature(s) and an energy fade or a discharge profile. The prediction system 170 may also train the ML model 270 using a selection of one or multiple features constructed using the training data from a diagnostic cycle. In one approach, the prediction system may train the ML model 270, model weights, or parameters according to supervised learning that relates a number of outcomes to the features. Examples of outcomes from training may be a cumulative energy output of a battery cell(s) before satisfying EOL criteria. The EOL criteria or threshold may be the fractional value of the discharge energy at different C-rates compared to the nominal discharge energy at similar C-rates. Examples of outcomes from training may also be the cumulative energy output during discharge at a diagnostic cycle, a fraction of discharge energy of a diagnostic cycle compared to a nominal discharge energy value, and so on. The prediction system 170 may continue the training by further acquiring training data during a diagnostic cycle.

At 660, the prediction system 170 determines if the predictions satisfy the criteria. In one approach, the criteria may be associated with confidence intervals, metrics, thresholds, and so on that the prediction system 170 can reliably use to determine satisfactory training of the ML model. For example, a criterion may provide that the ML model accurately forecasts degradation above 95% for a given feature set. The prediction system 170 may generate further features from data of the battery cell(s), select a different class of ML models or further tunes hyperparameters if the criteria is unsatisfied.

Figure 7:
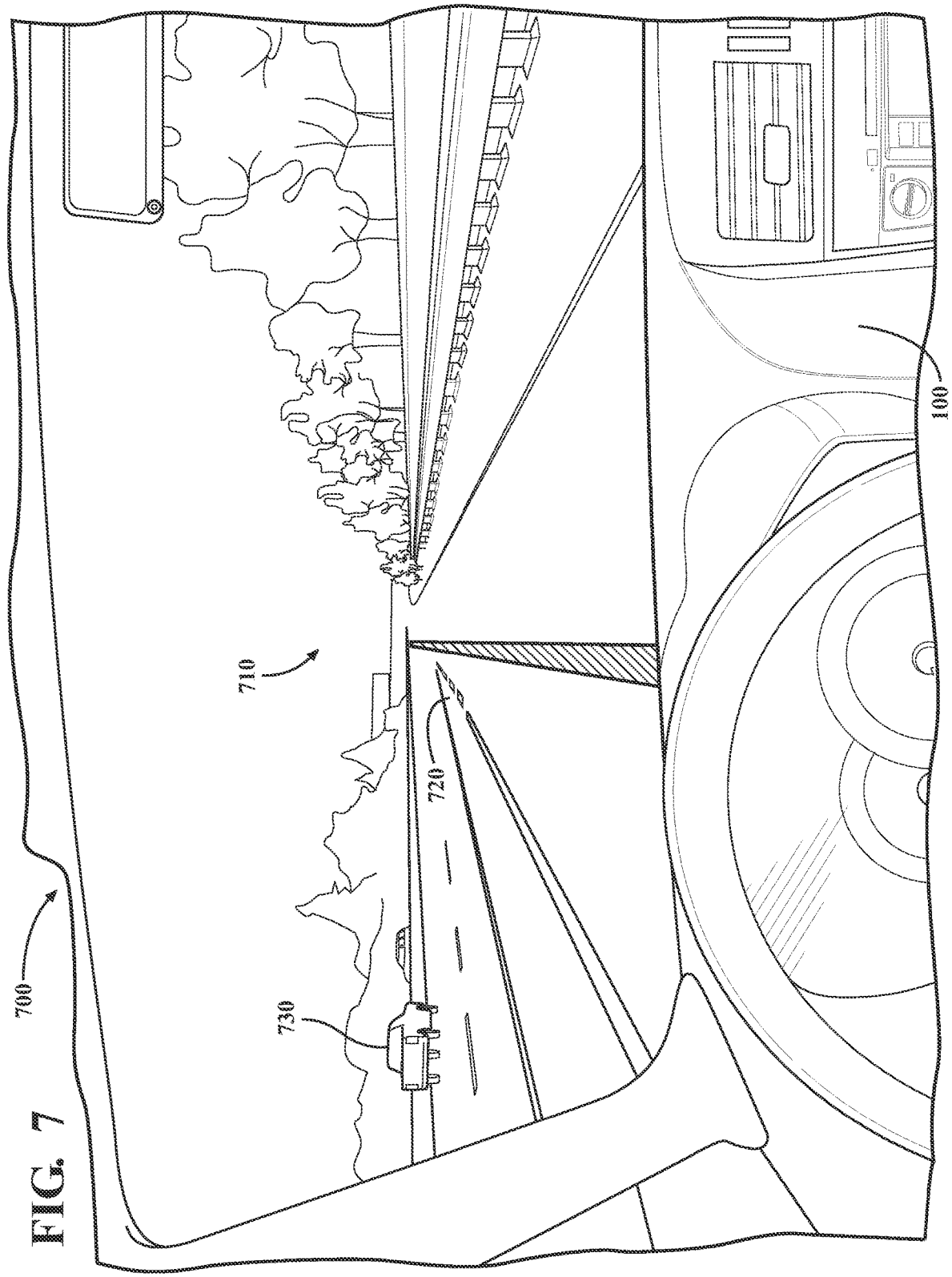
FIG. 7 illustrates a vehicle and a vehicle driving environment for predicting battery life using the data from a diagnostic cycle.

Turning now to FIG. 7, the diagram illustrates a vehicle and a vehicle driving environment 700 for predicting battery life using the data from a diagnostic cycle. In FIG. 7, the driving environment 710 may include the vehicle 100 traveling on the road 720 with another vehicle 730. In order to estimate range or road safety, the prediction system 170 for the vehicle 100 may identify a feature for operating conditions. The prediction system 170 may identify the feature according to electrochemical data from triggered electrochemical reaction(s). In this way, the identified features improve the prediction of the EOL in less cycles with increased accuracy for a battery cell(s) particular to the vehicle 100.

FIG. 1 will now be discussed in full detail as an example environment within which the system and methods disclosed herein may operate. In some instances, the vehicle 100 is configured to switch selectively between different modes of operation/control according to the direction of one or more modules/systems of the vehicle 100. In one approach, the modes include: 0, no automation; 1, driver assistance; 2, partial automation; 3, conditional automation; 4, high automation; and 5, full automation. In one or more arrangements, the vehicle 100 can be configured to operate in a subset of possible modes.

In one or more embodiments, the vehicle 100 is an automated or autonomous vehicle. As used herein, "automated vehicle" or "autonomous vehicle" refers to a vehicle that is capable of operating in an autonomous mode (e.g., category 5, full automation). "Autonomous mode" refers to navigating and/or maneuvering the vehicle 100 along a travel route using one or more computing systems to control the vehicle 100 with minimal or no input from a human driver. In one or more embodiments, the vehicle 100 is highly automated or completely automated. In one embodiment, the vehicle 100 is configured with one or more semi-autonomous operational modes in which one or more computing systems perform a portion of the navigation and/or maneuvering of the vehicle along a travel route, and a vehicle operator (i.e., driver) provides inputs to the vehicle to perform a portion of the navigation and/or maneuvering of the vehicle 100 along a travel route.

The vehicle 100 can include one or more processors 110. In one or more arrangements, the processor(s) 110 can be a main processor of the vehicle 100. For instance, the processor(s) 110 can be an electronic control unit (ECU), and an application-specific integrated circuit (ASIC), a microprocessor, etc. The vehicle 100 can include one or more data stores 115 for storing one or more types of data. The data stores 115 can include volatile and/or non-volatile memory. Examples of suitable data stores 115 include RAM, flash memory, ROM, Programmable Read-Only Memory (PROM, Erasable Programmable Read-Only Memory (EPROM), Electrically Erasable Programmable Read-Only Memory (EEPROM), registers, magnetic disks, optical disks, and hard drives. The data stores 115 can be a component of the processor(s) 110, or the data stores 115 can be operatively connected to the processor(s) 110 for use thereby. The term "operatively connected," as used throughout this description, can include direct or indirect connections, including connections without direct physical contact.

In one or more arrangements, the one or more data stores 115 can include map data 116. The map data 116 can include maps of one or more geographic areas. In some instances, the map data 116 can include information or data on roads, traffic control devices, road markings, structures, features, and/or landmarks in the one or more geographic areas. The map data 116 can be in any suitable form. In some instances, the map data 116 can include aerial views of an area. In some instances, the map data 116 can include ground views of an area, including 360-degree ground views. The map data 116 can include measurements, dimensions, distances, and/or information for one or more items included in the map data 116 and/or relative to other items included in the map data 116. The map data 116 can include a digital map with information about road geometry.

In one or more arrangements, the map data 116 can include one or more terrain maps 117. The terrain map(s) 117 can include information about the terrain, roads, surfaces, and/or other features of one or more geographic areas. The terrain map(s) 117 can include elevation data in the one or more geographic areas. The terrain map(s) 117 can define one or more ground surfaces, which can include paved roads, unpaved roads, land, and other things that define a ground surface.

In one or more arrangements, the map data 116 can include one or more static obstacle maps 118. The static obstacle map(s) 118 can include information about one or more static obstacles located within one or more geographic areas. A "static obstacle" is a physical object whose position does not change or substantially change over a period of time and/or whose size does not change or substantially change over a period of time. Examples of static obstacles can include trees, buildings, curbs, fences, railings, medians, utility poles, statues, monuments, signs, benches, furniture, mailboxes, large rocks, or hills. The static obstacles can be objects that extend above ground level. The one or more static obstacles included in the static obstacle map(s) 118 can have location data, size data, dimension data, material data, and/or other data associated with it. The static obstacle map(s) 118 can include measurements, dimensions, distances, and/or information for one or more static obstacles. The static obstacle map(s) 118 can be high quality and/or highly detailed. The static obstacle map(s) 118 can be updated to reflect changes within a mapped area.

The one or more data stores 115 can include sensor data 119. In this context, "sensor data" means any information about the sensors that the vehicle 100 is equipped with, including the capabilities and other information about such sensors. As will be explained below, the vehicle 100 can include the sensor system 120. The sensor data 119 can relate to one or more sensors of the sensor system 120. As an example, in one or more arrangements, the sensor data 119 can include information about one or more LIDAR sensors 124 of the sensor system 120.

In some instances, at least a portion of the map data 116 and/or the sensor data 119 can be located in one or more data stores 115 located onboard the vehicle 100. Alternatively, or in addition, at least a portion of the map data 116 and/or the sensor data 119 can be located in one or more data stores 115 that are located remotely from the vehicle 100.

As noted above, the vehicle 100 can include the sensor system 120. The sensor system 120 can include one or more sensors. "Sensor" means a device that can detect, and/or sense something. In at least one embodiment, the one or more sensors detect, and/or sense in real-time. As used herein, the term "real-time" means a level of processing responsiveness that a user or system senses as sufficiently immediate for a particular process or determination to be made, or that enables the processor to keep up with some external process.

In arrangements in which the sensor system 120 includes a plurality of sensors, the sensors may function independently or two or more of the sensors may function in combination. The sensor system 120 and/or the one or more sensors can be operatively connected to the processor(s) 110, the data stores 115, and/or another element of the vehicle 100.

The sensor system 120 can include any suitable type of sensor. Various examples of different types of sensors will be described herein. However, it will be understood that the embodiments are not limited to the particular sensors described. The sensor system 120 can include one or more vehicle sensors 121. The vehicle sensor(s) 121 can detect information about the vehicle 100 itself. In one or more arrangements, the vehicle sensor(s) 121 can be configured to detect position and orientation changes of the vehicle 100, such as, for example, based on inertial acceleration. In one or more arrangements, the vehicle sensor(s) 121 can include one or more accelerometers, one or more gyroscopes, an inertial measurement unit (IMU), a dead-reckoning system, a global navigation satellite system (GNSS), a global positioning system (GPS), a navigation system 147, and/or other suitable sensors. The vehicle sensor(s) 121 can be configured to detect one or more characteristics of the vehicle 100 and/or a manner in which the vehicle 100 is operating. In one or more arrangements, the vehicle sensor(s) 121 can include a speedometer to determine a current speed of the vehicle 100.

Alternatively, or in addition, the sensor system 120 can include one or more environment sensors 122 configured to acquire data about an environment surrounding the vehicle 100 in which the vehicle 100 is operating. "Surrounding environment data" includes data about the external environment in which the vehicle is located or one or more portions thereof. For example, the one or more environment sensors 122 can be configured to sense obstacles in at least a portion of the external environment of the vehicle 100 and/or data about such obstacles. Such obstacles may be stationary objects and/or dynamic objects. The one or more environment sensors 122 can be configured to detect other things in the external environment of the vehicle 100, such as, for example, lane markers, signs, traffic lights, traffic signs, lane lines, crosswalks, curbs proximate the vehicle 100, off-road objects, etc.

Various examples of sensors of the sensor system 120 will be described herein. The example sensors may be part of the one or more environment sensors 122 and/or the one or more vehicle sensors 121. However, it will be understood that the embodiments are not limited to the particular sensors described.

As an example, in one or more arrangements, the sensor system 120 can include one or more of a: radar sensors 123, LIDAR sensors 124, sonar sensors 125, weather sensors, haptic sensors, locational sensors, and/or one or more cameras 126. In one or more arrangements, the one or more cameras 126 can be high dynamic range (HDR) cameras, stereo or infrared (IR) cameras.

The vehicle 100 can include an input system 130. An "input system" includes components or arrangement or groups thereof that enable various entities to enter data into a machine. The input system 130 can receive an input from a vehicle occupant. The vehicle 100 can include an output system 135. An "output system" includes one or more components that facilitate presenting data to a vehicle occupant.

The vehicle 100 can include one or more vehicle systems 140. Various examples of the one or more vehicle systems 140 are shown in FIG. 1. However, the vehicle 100 can include more, fewer, or different vehicle systems. It should be appreciated that although particular vehicle systems are separately defined, any of the systems or portions thereof may be otherwise combined or segregated via hardware and/or software within the vehicle 100. The vehicle 100 can include a propulsion system 141, a braking system 142, a steering system 143, a throttle system 144, a transmission system 145, a signaling system 146, and/or a navigation system 147. Any of these systems can include one or more devices, components, and/or a combination thereof, now known or later developed.

The navigation system 147 can include one or more devices, applications, and/or combinations thereof, now known or later developed, configured to determine the geographic location of the vehicle 100 and/or to determine a travel route for the vehicle 100. The navigation system 147 can include one or more mapping applications to determine a travel route for the vehicle 100. The navigation system 147 can include a global positioning system, a local positioning system, or a geolocation system.

The processor(s) 110 and the autonomous driving module(s) 160 can be operatively connected to communicate with the various vehicle systems 140 and/or individual components thereof. For example, returning to FIG. 1, the processor(s) 110 and/or the autonomous driving module(s) 160 can be in communication to send and/or receive information from the various vehicle systems 140 to control the movement of the vehicle 100. The processor(s) 110 and/or the autonomous driving module(s) 160 may control some or all of the vehicle systems 140 and, thus, may be partially or fully autonomous as defined by the society of automotive engineers (SAE) levels 0 to 5.

The processor(s) 110 and/or the autonomous driving module(s) 160 can be operatively connected to communicate with the various vehicle systems 140 and/or individual components thereof. For example, returning to FIG. 1, the processor(s) 110 and/or the autonomous driving module(s) 160 can be in communication to send and/or receive information from the various vehicle systems 140 to control the movement of the vehicle 100. The processor(s) 110 and/or the autonomous driving module(s) 160 may control some or all of the vehicle systems 140.

The processor(s) 110 and/or the autonomous driving module(s) 160 may be operable to control the navigation and maneuvering of the vehicle 100 by controlling one or more of the vehicle systems 140 and/or components thereof. For instance, when operating in an autonomous mode, the processor(s) 110 and/or the autonomous driving module(s) 160 can control the direction and/or speed of the vehicle 100. The processor(s) 110 and/or the autonomous driving module(s) 160 can cause the vehicle 100 to accelerate, decelerate ( ) and/or change direction. As used herein, "cause" or "causing" means to make, force, compel, direct, command, instruct, and/or enable an event or action to occur or at least be in a state where such event or action may occur, either in a direct or indirect manner.

The vehicle 100 can include one or more actuators 150. The actuators 150 can be an element or a combination of elements operable to alter one or more of the vehicle systems 140 or components thereof responsive to receiving signals or other inputs from the processor(s) 110 and/or the autonomous driving module(s) 160. For instance, the one or more actuators 150 can include motors, pneumatic actuators, hydraulic pistons, relays, solenoids, and/or piezoelectric actuators, just to name a few possibilities.

The vehicle 100 can include one or more modules, at least some of which are described herein. The modules can be implemented as computer-readable program code that, when executed by a processor 110, implement one or more of the various processes described herein. One or more of the modules can be a component of the processor(s) 110, or one or more of the modules can be executed on and/or distributed among other processing systems to which the processor(s) 110 is operatively connected. The modules can include instructions (e.g., program logic) executable by one or more processor(s) 110. Alternatively, or in addition, one or more data stores 115 may contain such instructions.

The vehicle 100 can include one or more autonomous driving modules 160. The autonomous driving module(s) 160 can be configured to receive data from the sensor system 120 and/or any other type of system capable of capturing information relating to the vehicle 100 and/or the external environment of the vehicle 100. In one or more arrangements, the autonomous driving module(s) 160 can use such data to generate one or more driving scene models. The autonomous driving module(s) 160 can determine position and velocity of the vehicle 100. The autonomous driving module(s) 160 can determine the location of obstacles, obstacles, or other environmental features including traffic signs, trees, shrubs, neighboring vehicles, pedestrians, etc.

The autonomous driving module(s) 160 can be configured to receive, and/or determine location information for obstacles within the external environment of the vehicle 100 for use by the processor(s) 110, and/or one or more of the modules described herein to estimate position and orientation of the vehicle 100, vehicle position in global coordinates based on signals from a plurality of satellites, or any other data and/or signals that could be used to determine the current state of the vehicle 100 or determine the position of the vehicle 100 with respect to its environment for use in either creating a map or determining the position of the vehicle 100 in respect to map data.

The autonomous driving module(s) 160 either independently can be configured to determine travel path(s), current autonomous driving maneuvers for the vehicle 100, future autonomous driving maneuvers and/or modifications to current autonomous driving maneuvers based on data acquired by the sensor system 120, driving scene models, and/or data from any other suitable source such as determinations from the sensor data 240. "Driving maneuver" means one or more actions that affect the movement of a vehicle. Examples of driving maneuvers include: accelerating, decelerating, braking, turning, moving in a lateral direction of the vehicle 100, changing travel lanes, merging into a travel lane, and/or reversing, just to name a few possibilities. The autonomous driving module(s) 160 can be configured to implement determined driving maneuvers. The autonomous driving module(s) 160 can cause, directly or indirectly, such autonomous driving maneuvers to be implemented. As used herein, "cause" or "causing" means to make, command, instruct, and/or enable an event or action to occur or at least be in a state where such event or action may occur, either in a direct or indirect manner. The autonomous driving module(s) 160 can be configured to execute various vehicle functions and/or to transmit data to, receive data from, interact with, and/or control the vehicle 100 or one or more systems thereof (e.g., one or more of vehicle systems 140).

Detailed embodiments are disclosed herein. However, it is to be understood that the disclosed embodiments are intended as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations. Various embodiments are shown in FIGS. 1-7, but the embodiments are not limited to the illustrated structure or application.

The flowcharts and block diagrams in the figures illustrate the architecture, functionality, and operation of possible implementations of systems, methods, and computer program products according to various embodiments. In this regard, a block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The systems, components and/or processes described above can be realized in hardware or a combination of hardware and software and can be realized in a centralized fashion in one processing system or in a distributed fashion where different elements are spread across several interconnected processing systems. Any kind of processing system or another apparatus adapted for carrying out the methods described herein is suited. A typical combination of hardware and software can be a processing system with computer-usable program code that, when being loaded and executed, controls the processing system such that it carries out the methods described herein. The systems, components and/or processes also can be embedded in a computer-readable storage, such as a computer program product or other data programs storage device, readable by a machine, tangibly embodying a program of instructions executable by the machine to perform methods and processes described herein. These elements also can be embedded in an application product which comprises the features enabling the implementation of the methods described herein and, which when loaded in a processing system, is able to carry out these methods.

Furthermore, arrangements described herein may take the form of a computer program product embodied in one or more computer-readable media having computer-readable program code embodied, e.g., stored, thereon. Any combination of one or more computer-readable media may be utilized. The computer-readable medium may be a computer-readable signal medium or a computer-readable storage medium. The phrase "computer-readable storage medium" means a non-transitory storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: a portable computer diskette, a hard disk drive (HDD), a solid-state drive (SSD), a ROM, an EPROM or Flash memory, a portable compact disc read-only memory (CD-ROM), a digital versatile disc (DVD), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

Generally, modules as used herein include routines, programs, objects, components, data structures, and so on that perform particular tasks or implement particular data types. In further aspects, a memory generally stores the noted modules. The memory associated with a module may be a buffer or cache embedded within a processor, a RAM, a ROM, a flash memory, or another suitable electronic storage medium. In still further aspects, a module as envisioned by the present disclosure is implemented as an ASIC, a hardware component of a system on a chip (SoC), as a programmable logic array (PLA), or as another suitable hardware component that is embedded with a defined configuration set (e.g., instructions) for performing the disclosed functions.

Program code embodied on a computer-readable medium may be transmitted using any appropriate medium, including but not limited to wireless, wireline, optical fiber, cable, radio frequency (RF), etc., or any suitable combination of the foregoing. Computer program code for carrying out operations for aspects of the present arrangements may be written in any combination of one or more programming languages, including an object-oriented programming language such as Java™, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The phrase "at least one of . . . and . . . " as used herein refers to and encompasses any and possible combinations of one or more of the associated listed items. As an example, the phrase "at least one of A, B, and C" includes A, B, C, or any combination thereof (e.g., AB, AC, BC or ABC).

Aspects herein can be embodied in other forms without departing from the spirit or essential attributes thereof. Accordingly, reference should be made to the following claims, rather than to the foregoing specification, as indicating the scope hereof.

What is claimed is:

1. A prediction system comprising:
a memory communicably coupled to a processor and storing:
a prediction module including instructions that when executed by the processor cause the processor to:
measure data of a battery cell associated with an electrochemical reaction from a degradation mode having non-linear properties, and the degradation mode is triggered by tests during a diagnostic cycle;
identify a feature that correlates with degradation rates of the battery cell from the data by observations from varying discharge profiles and through grouping the tests according to physical properties, end-of-life (EOL) parameters, a series of chemical properties associated with the observations, and a number of cycles for the battery cell;
predict an EOL of the battery cell by using the feature in a machine learning (ML) model; and
cycle the battery cell according to the EOL for reducing the degradation rates.

2. The prediction system of claim 1, wherein the prediction module includes instructions to predict the EOL further including instructions to process the feature by the ML model to discover an unknown quality of the battery cell that satisfies criteria for accuracy of the EOL.

3. The prediction system of claim 1, wherein the prediction module includes instructions to identify the feature further including instructions to acquire information from measurements for the battery cell at operating conditions that vary to forecast the degradation rates.

4. The prediction system of claim 3, wherein the operating conditions represent an envelope of the battery cell.

5. The prediction system of claim 3, wherein the chemical properties are any one of a loss of active material (LAM), a loss of lithium inventory (LLI), and a retardation of internal kinetics associated with the battery cell.

6. The prediction system of claim 3, wherein the prediction module further includes instructions to identify characteristics of the degradation rates measured from a point or spectrum of the information.

7. The prediction system of claim 3, wherein the prediction module further includes instructions to correlate the feature to an energy fade or physical state of the battery cell and train the ML model using the feature.

8. The prediction system of claim 1, wherein the feature is related to any one of a rate performance test (RPT), hybrid pulse power characterization (HPPC) resistance, and HPPC relaxation of the battery cell.

9. The prediction system of claim 1, wherein the prediction module further includes instructions to determine a degradation condition internal to the battery cell according to the electrochemical reaction.

10. The prediction system of claim 1, wherein the EOL is associated with a life span of a battery pack that includes the battery cell.

11. A non-transitory computer-readable medium comprising:
instructions that when executed by a processor cause the processor to:
measure data of a battery cell associated with an electrochemical reaction from a degradation mode having non-linear properties, and the degradation mode is triggered by tests during a diagnostic cycle;
identify a feature that correlates with degradation rates of the battery cell from the data by observations from varying discharge profiles through grouping the tests according to physical properties, end-of-life (EOL) parameters, a series of chemical properties associated with the observations, and a number of cycles for the battery cell;
predict an EOL of the battery cell by using the feature in a machine learning (ML) model; and
cycle the battery cell according to the EOL for reducing the degradation rates.

12. A method, comprising:
measuring data of a battery cell associated with an electrochemical reaction from a degradation mode having non-linear properties, and the degradation mode is triggered by tests during a diagnostic cycle;
identifying a feature that correlates with degradation rates of the battery cell from the data by observations from varying discharge profiles and through grouping the tests according to physical properties, end-of-life (EOL) parameters, a series of chemical properties associated with the observations, and a number of cycles for the battery cell;
predicting an EOL of the battery cell by using the feature in a machine learning (ML) model; and
cycling the battery cell according to the EOL for reducing the degradation rates.

13. The method of claim 12, wherein predicting the EOL further comprises processing the feature by the ML model to discover an unknown quality of the battery cell that satisfies criteria for accuracy of the EOL.

14. The method of claim 12, wherein
identifying the feature further includes acquiring information from measurements for the battery cell at operating conditions that vary to forecast the degradation rates.

15. The method of claim 14, wherein the operating conditions represent an envelope of the battery cell.

16. The method of claim 14, wherein the chemical properties are any one of a loss of active material (LAM), a loss of lithium inventory (LLI), and a retardation of internal kinetics associated with the battery cell.

17. The method of claim 14, further comprising:
identifying characteristics of the degradation rates measured from a point or spectrum of the information.

18. The method of claim 14, further comprising:
correlating the feature to an energy fade or physical state of the battery cell; and
training the ML model using the feature.

19. The method of claim 12, wherein the feature is related to any one of a rate performance test (RPT), hybrid pulse power characterization (HPPC) resistance, and HPPC relaxation of the battery cell.

20. The method of claim 12, further comprising:
determining a degradation condition internal to the battery cell according to the electrochemical reaction.

* * * * *